(12) United States Patent
Zuo et al.

(10) Patent No.: US 10,008,516 B2
(45) Date of Patent: Jun. 26, 2018

(54) LTPS TFT ARRAY SUBSTRATE, ITS MANUFACTURING METHOD, AND DISPLAY DEVICE

(71) Applicant: BOE TECHNOLOGY GROUP CO., LTD., Beijing (CN)

(72) Inventors: Yueping Zuo, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 14/428,578

(22) PCT Filed: Jul. 16, 2014

(86) PCT No.: PCT/CN2014/082349
§ 371 (c)(1),
(2) Date: Mar. 16, 2015

(87) PCT Pub. No.: WO2015/067068
PCT Pub. Date: May 14, 2015

(65) Prior Publication Data
US 2016/0247823 A1    Aug. 25, 2016

(30) Foreign Application Priority Data

Nov. 8, 2013   (CN) .......................... 2013 1 0553574

(51) Int. Cl.
*H01L 27/12* (2006.01)
*H01L 29/786* (2006.01)
(Continued)

(52) U.S. Cl.
CPC ........ *H01L 27/124* (2013.01); *H01L 27/1222* (2013.01); *H01L 27/1262* (2013.01);
(Continued)

(58) Field of Classification Search
CPC ............. H01L 27/124; H01L 29/78678; H01L 27/1222; H01L 27/1262; H01L 29/41733;
(Continued)

(56) References Cited

U.S. PATENT DOCUMENTS 5,940,151 A * 8/1999 Ha ...................... G02F 1/13454
257/59
6,331,476 B1 * 12/2001 Kawakita .......... H01L 21/76802
257/E21.252
(Continued)

FOREIGN PATENT DOCUMENTS

CN         1236981 A      12/1999
CN         1929100 A      3/2007
(Continued)

OTHER PUBLICATIONS

Fourth Office Action regarding Chinese application No. 201310553574.7, dated May 3, 2016. Translation provided by Dragon Intellectual Property Law Firm.
(Continued)

*Primary Examiner* — Hoang-Quan Ho
(74) *Attorney, Agent, or Firm* — Harness, Dickey & Pierce, P.L.C.

(57) ABSTRACT

The present disclosure relates to the field of TFT manufacturing process, and provides an LTPS TFT array substrate, its manufacturing method and a display device. The LTPS TFT array substrate includes contact holes through which a source electrode and a drain electrode of the array substrate are connected to an active layer, respectively, wherein a conductive pattern connected to the active layer is provided at a base portion of the contact hole. According to the present disclosure, it is able to form an excellent ohmic contact between the source/drain electrodes and the active layer
(Continued)

source region          drain region after the contact holes have been etched, thereby to ensure the display quality of the display device.

14 Claims, 3 Drawing Sheets

(51) Int. Cl.
*H01L 29/417* (2006.01)
*H01L 29/45* (2006.01)

(52) U.S. Cl.
CPC ...... *H01L 29/41733* (2013.01); *H01L 29/458* (2013.01); *H01L 29/78603* (2013.01); *H01L 29/78675* (2013.01); *H01L 29/78678* (2013.01)

(58) Field of Classification Search
CPC ............. H01L 29/458; H01L 29/78603; H01L 29/78675
See application file for complete search history.

(56) References Cited

U.S. PATENT DOCUMENTS

| | | | | |
|---|---|---|---|---|
| 9,318,611 | B2* | 4/2016 | Amari | H01L 51/0021 |
| 2002/0016029 | A1* | 2/2002 | Kawakita | H01L 21/76802 |
| | | | | 438/156 |
| 2004/0087067 | A1* | 5/2004 | Yoneda | G02F 1/136227 |
| | | | | 438/148 |
| 2009/0121232 | A1 | 5/2009 | Huh et al. | |
| 2015/0021572 | A1* | 1/2015 | Amari | H01L 51/0021 |
| | | | | 257/40 |

FOREIGN PATENT DOCUMENTS

| | | |
|---|---|---|
| CN | 101414564 A | 4/2009 |
| CN | 102790096 A | 11/2012 |
| CN | 103545319 A | 1/2014 |

OTHER PUBLICATIONS

Third Office Action regarding Chinese application No. 201310553574.7, dated Nov. 5, 2015. Translation provided by Dragon Intellectual Property Law Firm.
Written Opinion of the International Searching Authority for international application No. PCT/CN2014/082349.
International Search Report and Written Opinion dated Jul. 16, 2014 regarding PCT/CN2014/082349.
Chinese Office Action dated Jan. 19, 2015 regarding Chinese Application No. 201310553574.7. Translation provided by Dragon Intellectual Property Law Firm.
Chinese Notification of Reexamination dated Dec. 15, 2017. Translation provided by Dragon Intellectual Property Law Firm.

\* cited by examiner

LTPS TFT ARRAY SUBSTRATE, ITS MANUFACTURING METHOD, AND DISPLAY DEVICE

CROSS-REFERENCE TO RELATED APPLICATION

This application is the U.S. national phase of PCT Application No. PCT/CN2014/082349 filed on Jul. 16, 2014, which claims priority to Chinese Patent Application No. 201310553574.7 filed on Nov. 8, 2013, the disclosures of which are incorporated in their entirety by reference herein.

TECHNICAL FIELD

The present disclosure relates to the field of thin film transistor (TFT) manufacturing process, in particular to a low temperature poly-silicon (LTPS) TFT array substrate, its manufacturing method, and a display device with the LTPS TFT array substrate.

BACKGROUND

For LTPS with regularly-arranged atoms, it has high carrier mobility (10 to 300 $cm^2/Vs$) and can provide a large driving current, so it may be used to accelerate the response time for liquid crystals, reduce a volume of a TFT and increase a transmittance area, thereby to achieve higher brightness and resolution. As a result, the LTPS has been widely used to manufacture an active layer in a process of manufacturing the TFT.

Referring to FIG. 1 and FIG. 2, which are schematic views of an LTPS TFT array substrate in the related art, 10 represents a base substrate, 11 represents a buffer layer, 13 represents an active layer, 14 represents a gate insulating layer, 15 represents a gate electrode, 16 represents an interlayer insulating layer, 170 represents a source electrode, and 171 represents a drain electrode. When manufacturing the array substrate in FIG. 1, a thickness of the gate insulating layer 14 plus the interlayer insulating layer 16 is larger than that of the active layer 13 (generally the thickness of the gate insulating layer plus the interlayer insulating layer is more than 10 times that of the active layer), and films are deposited and etched unevenly. Hence, in order to ensure contact holes to reach the active layer on the entire substrate, it is required for the contact holes by overetching the gate insulating layer and the interlayer insulating layer to a great extent. In the case that the gate insulating layer and the interlayer insulating layer are overetched, the relatively thin active layer will easily be overetched too. At this time, an ohmic contact between the source/drain electrodes and the active layer will be adversely affected and an on-state current will be decreased. As a result, the TFT characteristics and thereby the display of the display device will be adversely affected.

SUMMARY

An object of the present disclosure is to provide an LTPS TFT array substrate, its manufacturing method and a display device including the LTPS TFT array substrate, so as to form an excellent ohmic contact between source/drain electrodes of the array substrate and an active layer after contact holes have been formed by etching, thereby to ensure the display quality of the display device.

In one aspect, the present disclosure provides in an embodiment an LTPS TFT array substrate including contact holes through which a source electrode and a drain electrode of the array substrate are connected to an active layer, respectively, wherein a conductive pattern connected to the active layer is provided at a base portion of the contact hole.

In an example of the present disclosure, the conductive pattern is arranged underneath the active layer.

In another example of the present disclosure, the conductive pattern is a continuous film or a web-like film.

In yet another example of the present disclosure, the conductive pattern has a thickness less than or equal to that of the active layer.

In still yet another example of the present disclosure, the conductive pattern has a size greater than or equal to that of the contact hole, and arranged at a region corresponding to a source region or a drain region of the active layer.

In still yet another example of the present disclosure, the conductive pattern is made of at least one of Cu, Al, Ag, Mo, Cr, Nd, Ni, Mn, Ti, Ta, ITO, ZnO and W.

In still yet another example of the present disclosure, the array substrate includes:

a base substrate;
a buffer layer formed on the base substrate;
the conductive pattern formed on the buffer layer;
the active layer formed on the conductive pattern;
a gate insulating layer arranged on the active layer;
a gate electrode formed on the gate insulating layer;
an interlayer insulating layer formed on the gate electrode; and
the source electrode and the drain electrode formed on the interlayer insulating layer,
wherein the source electrode and the drain electrode are connected to the conductive patterns through the contact holes extending through the active layer, the gate insulating layer and the interlayer insulating layer, respectively.

In still yet another example of the present disclosure, the array substrate includes:

a base substrate;
a buffer layer formed on the base substrate;
a gate electrode formed on the buffer layer;
a gate insulating layer arranged on the gate electrode;
the conductive pattern formed on the gate insulating layer;
the active layer formed on the conductive pattern;
an interlayer insulating layer formed on the active layer; and
the source electrode and the drain electrode formed on the interlayer insulating layer,
wherein the source electrode and the drain electrode on the interlayer insulating layer are connected to the conductive patterns through the contact holes extending through the active layer and the interlayer insulating layer, respectively.

In another aspect, the present disclosure provides in an embodiment a display device including the above-mentioned LTPS TFT array substrate.

In yet another aspect, the present disclosure provides in an embodiment a method for manufacturing an LTPS TFT array substrate. The array substrate includes contact holes through which a source electrode and a drain electrode of the array substrate are connected to an active layer, respectively. Prior to forming the active layer, the method includes forming a conductive pattern connected to the active layer at a position corresponding to the contact hole.

In an example of the present disclosure, the method includes:

providing a base substrate;
forming a buffer layer on the base substrate;

forming the conductive pattern capable of being connected to the active layer on the buffer layer at a position corresponding to the contact hole by a single patterning process;

forming the active layer on the conductive pattern;

forming a gate insulating layer on the active layer;

forming patterns of a gate electrode and a gate line on the gate insulating layer;

forming an interlayer insulating layer on the base substrate with the gate electrode and the gate line;

etching the contact holes at positions corresponding to the source electrode and the drain electrode until the contact holes reach the conductive patterns; and forming patterns of a data line, the source electrode and the drain electrode on the interlayer insulating layer by a single patterning process, the source electrode and the drain electrode being connected to the conductive patterns through the contact holes extending through the active layer, the gate insulating layer and the interlayer insulating layer, respectively.

In another example of the present disclosure, the method includes:

providing a base substrate;

forming a buffer layer on the base substrate;

forming patterns of a gate electrode and a gate line on the buffer layer by a single patterning process;

forming a gate insulating layer on the base substrate with the gate electrode and the gate line;

forming the conductive pattern capable of being connected to the active layer on the gate insulating layer at a position corresponding to the contact hole by a single patterning process;

forming the active layer on the conductive pattern;

forming an interlayer insulating layer on the active layer;

etching the contact holes at positions corresponding to the source electrode and the drain electrode until the contact holes reach the conductive patterns; and forming patterns of a data line, the source electrode and the drain electrode on the interlayer insulating layer by a single patterning process, the source electrode and the drain electrode being connected to the conductive patterns through the contact holes extending through the active layer and the interlayer insulating layer, respectively.

The present disclosure has the following advantageous effects. According to the present disclosure, the conductive patterns connected to the active layer are provided at the base portions of the contact holes through which the source/drain electrodes are connected to the active layer. In this way, the source electrode and the drain electrode may be electrically connected to the active layer through the conductive patterns, respectively, so as to form an excellent ohmic contact between the source/drain electrodes and the active layer after the contact holes have been etched. In addition, the conductive pattern of the LTPS TFT array substrate is provided at the base portion of the contact hole and the etching of the contact hole is stopped at the conductive pattern (i.e., the conductive pattern may serve as an etch stopping layer), so the active layer may not be over-etched. As a result, it is able to prevent a doping process of the source electrode and the drain electrode from being adversely affected by an etching process of the contact holes, thereby to improve the stability and reliability of the process and ensure the display quality of the display device.

Figure 1:
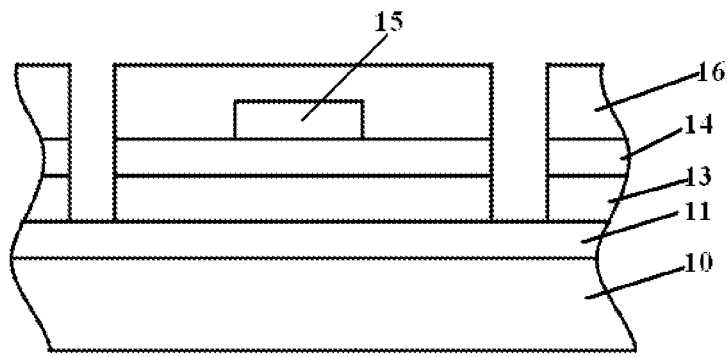
FIG. 1 is a schematic view showing an LTPS TFT array substrate in the relative art.

REFERENCE SIGNS 10 base substrate
11 buffer layer
120, 121 conductive pattern
13 active layer
14 gate insulating layer
15 gate electrode
16 interlayer insulating layer
170 source electrode
171 drain electrode
180, 181 contact hole

DETAILED DESCRIPTION

In order to make the objects, the technical solutions and the advantages of the present disclosure more apparent, the present disclosure will be described hereinafter in conjunction with the drawings and the embodiments.

The present disclosure provides an LTPS TFT array substrate, its manufacturing method and a display device including the LTPS TFT array substrate, so as to form an excellent ohmic contact between source/drain electrodes of the array substrate and an active layer after contact holes have been etched, thereby to ensure the display quality of the display device.

The present disclosure provides in an embodiment an LTPS TFT array substrate including contact holes through which a source electrode and a drain electrode of the array substrate are connected to an active layer, respectively, wherein a conductive pattern connected to the active layer is provided at a base portion of the contact hole.

Based on the above-mentioned structure, the source electrode and the drain electrode may be electrically connected to the active layer through the conductive patterns, respectively.

According to the LTPS TFT array substrate in such embodiments, the source electrode and the drain electrode are electrically connected to the active layer through the conductive patterns, respectively, so as to form an excellent ohmic contact between the source/drain electrodes and the active layer after the contact holes have been etched. In addition, the conductive pattern of the LTPS TFT array substrate is provided at the base portion of the contact hole and the etching of the contact hole is stopped at the conductive pattern (i.e., the conductive pattern may serve as an etch stopping layer), so the active layer may not be over-etched. As a result, it is able to prevent a doping process of the source electrode and the drain electrode from being adversely affected by an etching process of the contact holes, thereby to improve the stability and reliability of the process and ensure the display quality of a display device.

In an example of the present disclosure, the conductive pattern is arranged underneath the active layer.

In another example of the present disclosure, the conductive pattern may be a continuous film, or a web-like film with excellent electrical conductivity, and it has a thickness less than or equal to that of the active layer.

Further, the conductive pattern has a size greater than or equal to that of the contact hole, and it is arranged at a region corresponding to a source region or a drain region of the active layer. The conductive pattern may be made of at least one of Cu, Al, Ag, Mo, Cr, Nd, Ni, Mn, Ti, Ta and W. In an embodiment of the present disclosure, the conductive pattern may also be made of a metal oxide with excellent electrical conductivity, e.g., ITO or IZO. In another embodiment of the present disclosure, the conductive pattern may also be made of a ZnO:Al film or a ZnO:Al web-like film.

In an embodiment of the present disclosure, the array substrate may include:
a base substrate;
a buffer layer formed on the base substrate;
the conductive pattern formed on the buffer layer;
the active layer formed on the conductive pattern;
a gate insulating layer formed on the active layer;
a gate electrode formed on the gate insulating layer;
an interlayer insulating layer formed on the gate electrode; and
the source electrode and the drain electrode formed on the interlayer insulating layer,
wherein the source electrode and the drain electrode are connected to the conductive patterns through the contact holes extending through the active layer, the gate insulating layer and the interlayer insulating layer, respectively.

Figure 5:
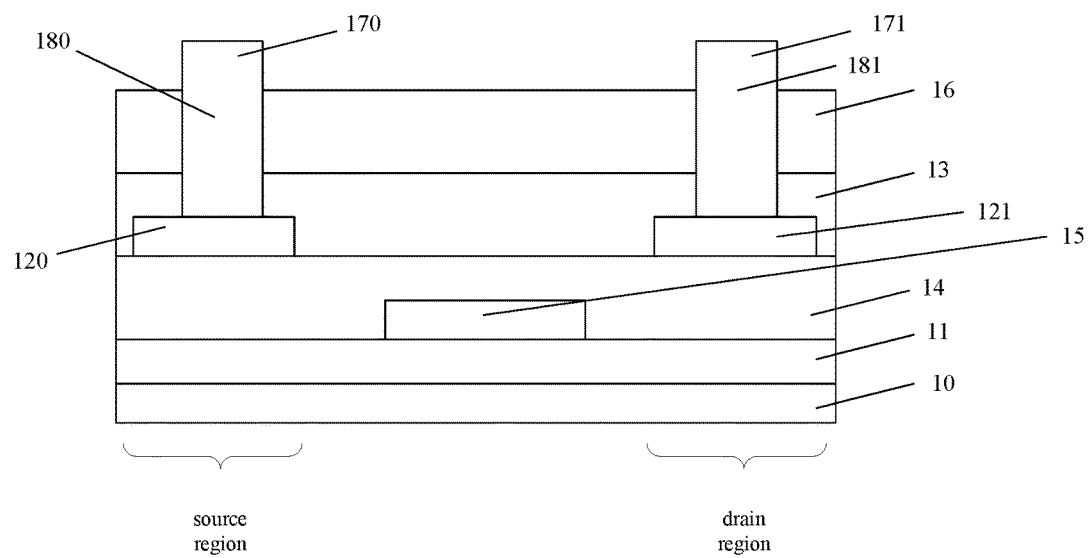
FIG. 5 is a schematic view showing an LTPS TFT array substrate according to an embodiment of the present disclosure.

In another embodiment of the present disclosure (as shown in FIG. 5), the array substrate may include:
a base substrate;
a buffer layer formed on the base substrate;
a gate electrode formed on the buffer layer;
a gate insulating layer formed on the gate electrode;
the conductive pattern formed on the gate insulating layer;
the active layer formed on the conductive pattern;
an interlayer insulating layer formed on the active layer; and
the source electrode and the drain electrode formed on the interlayer insulating layer,
wherein the source electrode and the drain electrode are connected to the conductive patterns through the contact holes extending through the active layer and the interlayer insulating layer, respectively.

The present disclosure further provides in an embodiment a display device including the above-mentioned LTPS TFT array substrate. The LTPS TFT array substrate has the structure mentioned above and thus will not be repeated herein. In addition, the structures of other parts in the display device may refer to the related art, and they are not particularly defined herein. The display device may be any products or members having a display function, e.g., a display panel, an electronic paper, a TV, a display, a digital photo frame, a mobile phone or a flat-panel PC.

The present disclosure further provides in an embodiment a method for manufacturing an LTPS TFT array substrate. The array substrate includes contact holes through which a source electrode and a drain electrode of the array substrate are connected to an active layer, respectively. Prior to forming the active layer, the method includes forming a conductive pattern connected to the active layer at a position corresponding to the contact hole.

According to the method for manufacturing the LTPS TFT array substrate in such embodiments, the conductive patterns connected to the active layer are provided at the base portions of the contact holes through which the source/drain electrodes are connected to the active layer. In this way, the source electrode and the drain electrode may be electrically connected to the active layer through the conductive patterns, respectively, so as to form an excellent ohmic contact between the source/drain electrodes and the active layer after the contact holes have been etched. In addition, the conductive pattern of the LTPS TFT array substrate is provided at the base portion of the contact hole and the etching of the contact hole is stopped at the conductive pattern (i.e., the conductive pattern may serve as an etch stopping layer), so the active layer may not be overetched. As a result, it is able to prevent a doping process of the source electrode and the drain electrode from being adversely affected by an etching process of the contact holes, thereby to improve the stability and reliability of the process and ensure the display quality of the display device.

In an embodiment of the present disclosure, the method may include:
providing a base substrate;
forming a buffer layer on the base substrate;
forming the conductive pattern capable of being connected to the active layer on the buffer layer at a position corresponding to the contact hole by a single patterning process;
forming the active layer on the conductive pattern;
forming a gate insulating layer on the active layer;
forming patterns of a gate electrode and a gate line on the gate insulating layer;
forming an interlayer insulating layer on the base substrate with the gate electrode and the gate line;
etching the contact holes at positions corresponding to the source electrode and the drain electrode until the contact holes reach the conductive patterns; and
forming patterns of a data line, the source electrode and the drain electrode on the interlayer insulating layer by a single patterning process, the source electrode and the drain electrode being connected to the conductive patterns through the contact holes extending through the active layer, the gate insulating layer and the interlayer insulating layer, respectively.

In another embodiment of the present disclosure, the method may include:
providing a base substrate;
forming a buffer layer on the base substrate;
forming patterns of a gate electrode and a gate line on the buffer layer by a single patterning process;
forming a gate insulating layer on the base substrate with the gate electrode and the gate line;
forming the conductive pattern capable of being connected to the active layer on the gate insulating layer at a position corresponding to the contact hole by a single patterning process;
forming the active layer on the conductive pattern;
forming an interlayer insulating layer on the active layer;
etching the contact holes at positions corresponding to the source electrode and the drain electrode until the contact holes reach the conductive patterns; and
forming patterns of a data line, the source electrode and the drain electrode on the interlayer insulating layer by a single patterning process, the source electrode and the drain electrode being connected to the conductive patterns through the contact holes extending through the active layer and the interlayer insulating layer, respectively.

The LTPS TFT array substrate and its manufacturing method according to embodiments of the present disclosure will be described hereinafter in conjunction with specific examples.

Figure 2:
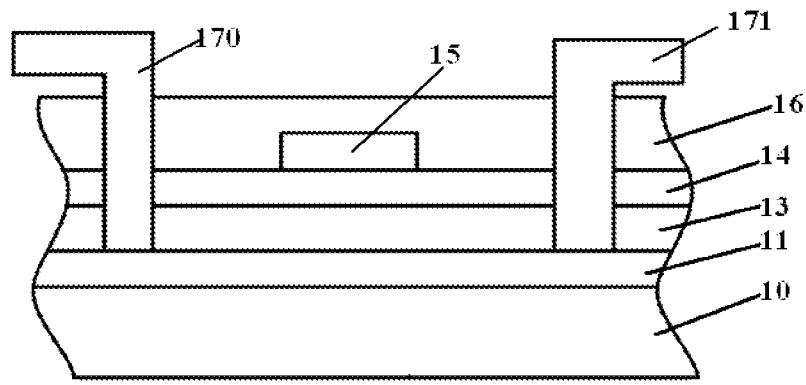
FIG. 2 is a schematic view showing an LTPS TFT array substrate where a source electrode and a drain electrode are connected to an active layer through contact holes in the relative art.

As shown in FIG. 1 and FIG. 2, when manufacturing an LTPS TFT array substrate in the related art, a thickness of the gate insulating layer plus the interlayer insulating layer is larger than that of the active layer (generally the thickness of the gate insulating layer plus the interlayer insulating layer is more than 10 times the thickness of the active layer), and the films are deposited and etched unevenly. Hence, in order to ensure the contact holes to reach the active layer on the entire substrate, it is required to form the contact holes by overetching the gate insulating layer and the interlayer insulating layer to a great extent. In the case that the gate insulating layer and the interlayer insulating layer are overetched, the relatively thin active layer will easily be overetched too and the thickness of the active layer at regions corresponding to the contact holes will be reduced. At this time, an ohmic contact between the source electrode 170/drain electrode 171 and the active layer 13 will be adversely affected and an on-state current will be decreased. As a result, the TFT characteristics and thereby the display of the display device will be adversely affected.

In order to overcome this drawback, a gas with a high selective ratio may be selected to etch the contact holes, and the etching is stopped immediately after the gate insulating layer or the interlayer insulating layer has been etched or when merely a part of the active layer is etched. However, this will result in a more complex etching process, i.e., it is difficult to control the etching evenness and the selective ratio, the time required for the etching will be prolonged and a small process window will be provided.

Figure 3:
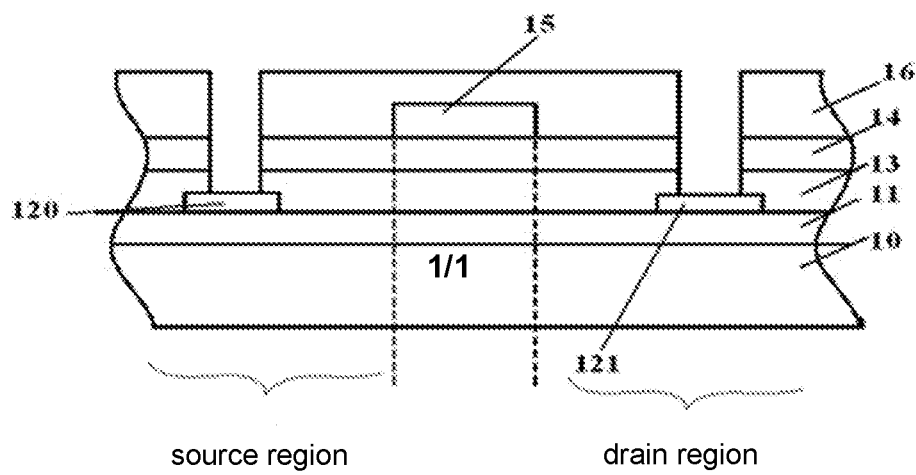
FIG. 3 is a schematic view showing an LTPS TFT array substrate according to an embodiment of the present disclosure.
Figure 4:
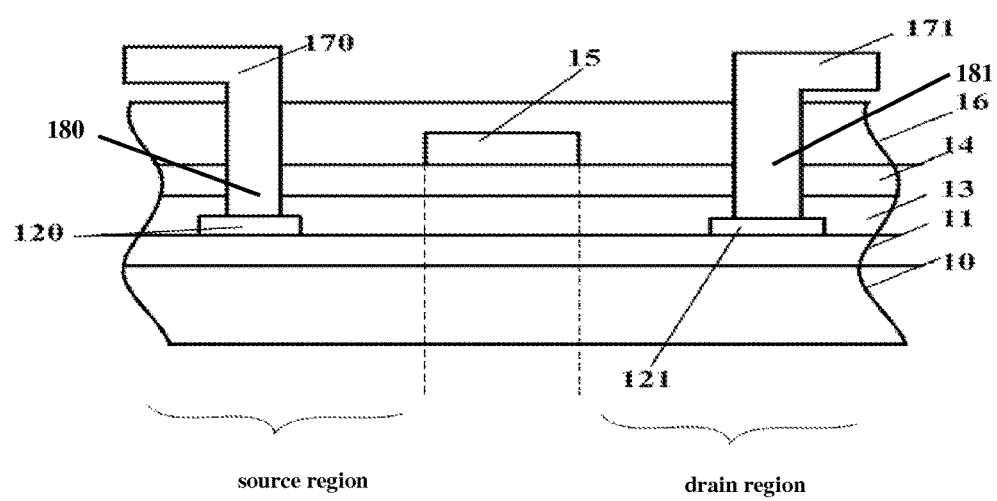
FIG. 4 is a schematic view showing the LTPS TFT array substrate where a source electrode and a drain electrode are connected to an active layer through contact holes according to an embodiment of the present disclosure.

In this regard, as shown in FIG. 3 and FIG. 4, for the LTPS TFT array substrate according to embodiments of the present disclosure, the conductive patterns 120, 121 connected to the active layer 13 are arranged at the base portions of the contact holes 180, 181 through which the source electrode 170 and the drain electrode 171 are connected to the active layer 13, respectively. The conductive pattern may serve as an etch stopping layer, and during the etching, the contact holes 180 and 181 are stopped at the etching stop layer, i.e., the conductive patterns arranged between the active layer 13 and the buffer layer 11, so as to prevent the active layer from being overetched. In this way, the source electrode 170 may be electrically connected to the active layer 13 through the conductive pattern 120, and the drain electrode 171 may be electrically connected to the active layer 13 through the conductive pattern 121, so as to form an excellent ohmic contact between the source/drain electrodes and the active layer after the contact holes 180, 181 have been etched. Moreover, the conductive patterns are arranged at the base portions of the contact holes 180, 181, so that the etching of the contact holes is stopped at the conductive patterns and the active layer is not overetched. As a result, it is able to prevent the doping process of the source electrode and the drain electrode from being adversely affected by the etching process of the contact holes, thereby to improve the stability and reliability of the process and ensure the display quality of the display device.

Embodiment 1

In this embodiment, the LTPS TFT array substrate with a top-gate structure may be manufactured by the following steps.

Step a1: providing the base substrate 10 and forming the buffer layer 11 on the base substrate 10.

The base substrate 10 may be a glass or quartz substrate. In an example of the present disclosure, the buffer layer 11 having a thickness of about 2000 Å to about 6000 Å may be deposited on the base substrate 10 by plasma enhanced chemical vapor deposition (PECVD). The buffer layer may be made of an oxide, a nitride or an oxynitride, and it may be of a single-layered, double-layered or multi-layered structure. In another example of the present disclosure, the buffer layer may be made of SiNx, SiOx or Si(ON)x.

Step a2: forming the conductive patterns 120, 121 capable of being connected to the active layer on the buffer layer 11 at positions corresponding to the contact holes 180, 181.

In an example of the present disclosure, a conductive metal layer may be deposited on the base substrate 10 by sputtering or thermal evaporation. The conductive metal layer may be made of Cu, Al, Ag, Mo, Cr, Nd, Ni, Mn, Ti, Ta or W, or an alloy thereof. The conductive metal layer may also be made of a metal oxide with excellent electrical conductivity, e.g., an ITO or IZO film. In another example of the present disclosure, the conductive metal layer may also be made of a ZnO:Al film or a ZnO:Al web-like film. The conductive metal layer may be of a single-layered structure, or a multi-layered structure such as Cu/Mo, Ti/Cu/Ti or Mo/Al/Mo. A photoresist is applied onto the conductive metal layer and then exposed with a mask plate, so as to form a photoresist reserved region corresponding to regions where the contact holes 180, 181 are located and a photoresist unreserved region corresponding to a region other than the above patterns. Then, exposed photoresist is developed so as to fully remove the photoresist at the photoresist unreserved region, and a thickness of the photoresist at the photoresist reserved region remains unchanged. The conductive metal layer corresponding to the photoresist unreserved region is fully etched off by an etching process, and the remaining photoresist is removed, so as to form the conductive patterns 120, 121. The conductive patterns 120, 121 each have a size greater than or equal to that of the contact holes 180, 181, and they do not extend beyond the regions corresponding to the source region and the drain region of the active layer. The resultant conductive pattern may be a continuous film or a web-like film.

Step a3: forming a pattern of the active layer 13 on the base substrate 10 obtained in Step a2.

In an example of the present disclosure, an LTPS film may be deposited on the base substrate 10 obtained in Step a2 by magnetron sputtering, thermal evaporation or any other film-forming methods, so as to form the active layer 13 including the source region and the drain region.

Step a4: forming the gate insulating layer 14 on the base substrate 10 obtained in Step a3.

In an example of the present disclosure, the gate insulating layer 14 having a thickness of about 2000 Å to about 6000 Å may be deposited on the base substrate 10 obtained in Step a3 by PECVD. The gate insulating layer may be made of an oxide, a nitride or an oxynitride, and it may be of a single-layered, double-layered or multi-layered structure. In another example of the present disclosure, the gate insulating layer may be made of SiNx, SiOx or Si(ON)x, and it may be of a double-layered structure made of silicon nitride and silicon oxide.

Step a5: forming patterns of the gate electrode 15 and the gate line on the base substrate 10 obtained in Step a4 by a single patterning process.

In an example of the present disclosure, a gate metal layer having a thickness of 2500 Å to 16000 Å may be deposited on the gate insulating layer 14 by sputtering or thermal evaporation. The gate metal layer may be made of Cu, Al, Ag, Mo, Cr, Nd, Ni, Mn, Ti, Ta or W, or an alloy thereof. The gate metal layer may be of a single-layered structure, or a multi-layered structure such as Cu/Mo, Ti/Cu/Ti or Mo/Al/Mo. A photoresist is applied onto the gate metal layer and then exposed with a mask plate, so as to form a photoresist reserved region corresponding to regions where the patterns of the gate line and the gate electrode are located and a photoresist unreserved region corresponding to a region other than the above patterns. Then exposed photoresist is developed so as to fully remove the photoresist at the photoresist unreserved region, and a thickness of the photoresist at the photoresist reserved region remains unchanged. The gate metal layer corresponding to the photoresist unreserved region is fully etched off by an etching process, and then the remaining photoresist is removed, so as to form the patterns of the gate line and the gate electrode 15.

Step a6: forming the interlayer insulating layer 16 on the base substrate 10 obtained in Step a5.

In an example of the present disclosure, the interlayer insulating layer having a thickness of 400 Å to 5000 Å may be deposited on the base substrate 10 obtained in Step a5 by magnetron sputtering, thermal evaporation, PECVD or any other film-forming methods. The interlayer insulating layer may be made of an oxide, a nitride or an oxynitride. In another example of the present disclosure, the interlayer insulating layer may be made of SiNx, SiOx or Si(ON)x. The interlayer insulating layer may be of a single-layered structure, or a double-layered structure made of silicon nitride and silicon oxide.

Step a7: etching the contact holes at positions corresponding to the source electrode and the drain electrode until the contact holes reach the conductive patterns.

In an example of the present disclosure, the active layer, the gate insulating layer and the interlayer insulating layer may be etched by dry or wet etching, so as to form the contact holes extending through the active layer, the gate insulating layer and the interlayer insulating layer. After the contact holes have been etched, the thickness of the conductive pattern is not greater than that of the active layer.

Step a8: forming patterns of the data line, the source electrode and the drain electrode on the base substrate 10 obtained in Step a7 by a single patterning process.

In an example of the present disclosure, a source/drain metal layer having a thickness of about 2000 Å to about 6000 Å may be deposited on the base substrate 10 obtained in Step a7 by magnetron sputtering, thermal evaporation or any other film-forming methods. The source/drain metal layer may be made of Cu, Al, Ag, Mo, Cr, Nd, Ni, Mn, Ti, Ta or W, or an alloy thereof. The source/drain metal layer may be of a single-layered structure, or a multi-layered structure such as Cu/Mo, Ti/Cu/Ti or Mo/Al/Mo. A photoresist is applied onto the source/drain metal layer and then exposed with a mask plate, so as to form a photoresist reserved region corresponding to regions where the patterns of the source electrode, the drain electrode and the data line are located and a photoresist unreserved region corresponding to a region other than the above patterns. Then, exposed photoresist is developed so as to fully remove the photoresist at the photoresist unreserved region, and a thickness of the photoresist at the photoresist reserved region remains unchanged. The source/drain metal layer corresponding to the photoresist unreserved region is fully etched off by an etching process, and then the remaining photoresist is removed, so as to form the data line, the source electrode 170 and the drain electrode 171. As shown in FIG. 4, the source electrode 170 is connected to the conductive pattern 120 through the contact hole 180, and the drain electrode 171 is connected to the conductive pattern 121 through the contact hole 181.

Through the above Steps a1 to a8, it is able to manufacture the LTPS TFT array substrate as shown in FIG. 3 and FIG. 4. In the LTPS TFT array substrate according to this embodiment, the conductive patterns connected to the active layer are provided at the base portions of the contact holes through which the source/drain electrodes are connected to the active layer. In this way, the source electrode and the drain electrode may be electrically connected to the active layer through the conductive patterns, respectively, so as to form an excellent ohmic contact between the source/drain electrodes and the active layer after the contact holes have been etched. In addition, the conductive pattern may serve as an etch stopping layer, then the active layer will not be over-etched. As a result, it is able to prevent a doping process of the source electrode and the drain electrode from being adversely affected by an etching process of the contact holes, thereby to improve the stability and reliability of the process and ensure the display quality of the display device.

Embodiment 2

In this embodiment, the LTPS TFT array substrate with a bottom-gate structure may be manufactured by the following steps.

Step b1: providing the base substrate and forming the buffer layer on the base substrate.

In an example of the present disclosure, the base substrate may be a glass or quartz substrate. In another example of the present disclosure, the buffer layer having a thickness of about 2000 Å to about 6000 Å may be deposited on the base substrate by PECVD. The buffer layer may be made of an oxide, a nitride or an oxynitride, and it may be of a single-layered, double-layered or multi-layered structure. In still another example of the present disclosure, the buffer layer may be made of SiNx, SiOx or Si(ON)x.

Step b2: forming patterns of the gate electrode and the gate line on the base substrate obtained in Step b1 by a single patterning process.

In an example of the present disclosure, a gate metal layer having a thickness of 2500 Å to 16000 Å may be deposited on the buffer layer by sputtering or thermal evaporation. The gate metal layer may be made of Cu, Al, Ag, Mo, Cr, Nd, Ni, Mn, Ti, Tb or W, or an alloy thereof, and it may be of a single-layered structure, or a multi-layered structure such as Cu/Mo, Ti/Cu/Ti, Mo/Al/Mo. A photoresist is applied onto the gate metal layer and then exposed with a mask plate, so as to form a photoresist reserved region corresponding to regions where the patterns of the gate line and the gate electrode are located and a photoresist unreserved region corresponding to a region other than the above patterns. Then, exposed photoresist is developed so as to fully remove the photoresist at the photoresist unreserved region, and a thickness of the photoresist at the photoresist reserved region remains unchanged. The gate metal layer corresponding to the photoresist unreserved region is fully etched off by an etching process, and the remaining photoresist is removed, so as to form the patterns of the gate line and the gate electrode.

Step b3: forming the gate insulating layer on the base substrate obtained in Step b2.

In an example of the present disclosure, the gate insulating layer having a thickness of about 2000 Å to about 6000 Å may be deposited on the based substrate obtained in Step b2 by PECVD. The gate insulating layer may be made of an oxide, a nitride or an oxynitride, and it may be of a single-layered, double-layered or multi-layered structure. In another example of the present disclosure, the gate insulating layer may be made of SiNx, SiOx or Si(ON)x, and it may also be of a double-layered structure made of silicon nitride and silicon oxide.

Step b4: forming the conductive patterns capable of being connected to the active layer on the gate insulating layer at positions corresponding to the contact holes.

In an example of the present disclosure, a conductive metal layer may be deposited on the base substrate obtained in Step b3 by sputtering or thermal evaporation. The conductive metal layer may be made of Cu, Al, Ag, Mo, Cr, Nd, Ni, Mn, Ti, Tb or W, or an alloy thereof, and it may be of a single-layered structure, or a multi-layered structure such as Cu/Mo, Ti/Cu/Ti or Mo/Al/Mo. A photoresist is applied onto the conductive metal layer and then exposed with a mask plate, so as to form a photoresist reserved region corresponding to regions where the contact holes are located and a photoresist unreserved region corresponding a region other than the above patterns. Then, exposed photoresist is developed so as to fully remove the photoresist at the photoresist unreserved region, and a thickness of the photoresist at the photoresist reserved region remains unchanged. The conductive metal layer corresponding to the photoresist unreserved region is fully etched off by an etching process, and the remaining photoresist is removed, so as to form the conductive patterns. The conductive patterns each have a size greater than or equal to that of the contact hole, and does not extend beyond a region corresponding to the source or drain region of the active layer.

Step b5: forming a pattern of the active layer on the base substrate obtained in Step b4.

In an example of the present disclosure, an LTPS film may be deposited on the base substrate obtained in Step b4 by magnetron sputtering, thermal evaporation or any other film-forming methods, so as to form the active layer including the source region and the drain region.

Step b6: forming the interlayer insulating layer on the base substrate obtained in Step b5.

In an example of the present disclosure, the interlayer insulating layer having a thickness of 400 Å to 5000 Å may be deposited on the base substrate obtained in Step b5 by magnetron sputtering, thermal evaporation, PECVD or any other film-forming methods. The interlayer insulating layer may be made of an oxide, a nitride or an oxynitride. In another example of the present disclosure, the interlayer insulating layer may be made of SiNx, SiOx or Si(ON)x, and it may be of a single-layered structure, or a multi-layered structure made of silicon nitride and silicon oxide.

Step b7: etching the contact holes at positions corresponding to the source electrode and the drain electrode until the contact holes reach the conductive patterns.

In an example of the present disclosure, the active layer and the interlayer insulating layer may be etched by dry or wet etching, so as to form the contact holes extending through the active layer and the interlayer insulating layer. After the contact holes have been etched, the conductive pattern has a thickness not greater than that of the active layer.

Step b8: forming patterns of the data line, the source electrode and the drain electrode on the base substrate obtained in Step b7 by a single patterning process.

In an example of the present disclosure, a source/drain metal layer having a thickness of about 2000 Å to about 6000 Å may be deposited on the base substrate obtained in Step b7 by magnetron sputtering, thermal evaporation or any other film-forming methods. The source/drain metal layer may be made of Cu, Al, Ag, Mo, Cr, Nd, Ni, Mn, Ti, Tb or W, or an alloy thereof, and it may be of a single-layered structure, or a multi-layered structure such as Cu/Mo, Ti/Cu/Ti or Mo/Al/Mo. A photoresist is applied onto the source/drain metal layer and then exposed with a mask plate, so as to form a photoresist reserved region corresponding to regions where the patterns of the source electrode, the drain electrode and the date line are located and a photoresist unreserved region corresponding to a region other than the above patterns. Then, exposed photoresist is developed so as to fully remove the photoresist at the photoresist-unreserved region, and a thickness of the photoresist at the photoresist reserved region remains unchanged. The source/drain metal layer corresponding to the photoresist unreserved region is fully etched off by an etching process, and the remaining photoresist is removed, so as to form the data line, the source electrode and the drain electrode. The source electrode and the drain electrode are connected to the conductive patterns through the contact holes, respectively.

Through the above Steps b1 to b8, it is able to manufacture the LTPS TFT array substrate. In the LTPS TFT array substrate according to this embodiment, the conductive patterns connected to the active layer are provided at the base portions of the contact holes through which the source/drain electrodes are connected to the active layer, respectively. In this way, the source electrode and the drain electrode may be electrically connected to the active layer through the conductive patterns, respectively, so as to form an excellent ohmic contact between the source/drain electrodes and the active layer after the contact holes have been etched. In addition, the conductive pattern may serve as an etch stopping layer, then the active layer will not be overetched. As a result, it is able to prevent a doping process of the source electrode and the drain electrode from being adversely affected by an etching process of the contact holes, thereby to improve the stability and reliability of the process and ensure the display quality of the display device.

According to the above embodiments of the present disclosure, the conductive patterns connected to the active layer are provided at the base portions of the contact holes through which the source/drain electrodes are connected to the active layer. In this way, the source electrode and the drain electrode may be electrically connected to the active layer through the conductive patterns, respectively, so as to form an excellent ohmic contact between the source/drain electrodes and the active layer after the contact holes have been etched. In addition, the conductive pattern of the LTPS TFT array substrate is provided at the base portion of the contact hole and the etching of the contact hole is stopped at the conductive pattern (i.e., the conductive pattern may serve as an etch stopping layer), so the active layer will not be overetched. As a result, it is able to prevent a doping process of the source electrode and the drain electrode from being adversely affected by an etching process of the contact holes, thereby to improve the stability and reliability of the process and ensure the display quality of the display device.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A poly-silicon thin film transistor (TFT) array substrate, comprising contact holes through which a source electrode and a drain electrode of the array substrate are connected to an active layer, respectively, wherein a conductive pattern connected to the active layer is provided at a base portion of the contact hole, the contact hole extends into the active layer, and the conductive pattern is a web-like film.

2. The poly-silicon TFT array substrate according to claim 1, wherein the conductive pattern is arranged underneath the active layer.

3. The poly-silicon TFT array substrate according to claim 1, wherein the conductive pattern has a thickness less than or equal to that of the active layer.

4. The poly-silicon TFT array substrate according to claim 1, wherein the conductive pattern has a size greater than or equal to that of the contact hole, and arranged at a region corresponding to a source region or a drain region of the active layer.

5. The poly-silicon TFT array substrate according to claim 1, wherein the conductive pattern is made of ZnO:Al.

6. The poly-silicon TFT array substrate according to claim 1, comprising:
a base substrate;
a buffer layer formed on the base substrate;
the conductive pattern formed on the buffer layer;
the active layer formed on the conductive pattern;
a gate insulating layer arranged on the active layer;
a gate electrode formed on the gate insulating layer;
an interlayer insulating layer formed on the gate electrode; and
the source electrode and the drain electrode formed on the interlayer insulating layer,
wherein the source electrode and the drain electrode are connected to the conductive patterns through the contact holes which extend into the active layer and extend through the gate insulating layer and the interlayer insulating layer, respectively.

7. The poly-silicon TFT array substrate according to claim 1, comprising:
a base substrate;
a buffer layer formed on the base substrate;
a gate electrode formed on the buffer layer;
a gate insulating layer arranged on the gate electrode;
the conductive pattern formed on the gate insulating layer;
the active layer formed on the conductive pattern;
an interlayer insulating layer formed on the active layer; and
the source electrode and the drain electrode formed on the interlayer insulating layer,
wherein the source electrode and the drain electrode are connected to the conductive patterns through the contact holes which extend into the active layer and extend through the interlayer insulating layer, respectively.

8. A display device comprising a poly-silicon thin film transistor (TFT) array substrate, wherein the array substrate comprises contact holes through which a source electrode and a drain electrode of the array substrate are connected to an active layer, respectively, wherein a conductive pattern connected to the active layer is provided at a base portion of the contact hole, the contact hole extends into the active layer, and the conductive pattern is a web-like film.

9. A method for manufacturing a poly-silicon thin film transistor (TFT) array substrate, wherein the array substrate comprises contact holes through which a source electrode and a drain electrode of the array substrate are connected to an active layer, respectively, wherein a conductive pattern connected to the active layer is provided at a base portion of the contact hole, and the contact hole extends into the active layer, wherein prior to forming the active layer, the method comprises forming the conductive pattern connected to the active layer at a position corresponding to the contact hole, and the conductive pattern is a web-like film.

10. The method according to claim 9, comprising:
providing a base substrate;
forming a buffer layer on the base substrate;
forming the conductive pattern capable of being connected to the active layer on the buffer layer at a position corresponding to the contact hole by a single patterning process;
forming the active layer on the conductive pattern;
forming a gate insulating layer on the active layer;
forming patterns of a gate electrode and a gate line on the gate insulating layer;
forming an interlayer insulating layer on the base substrate with the gate electrode and the gate line;
etching the contact holes at positions corresponding to the source electrode and the drain electrode until the contact holes reach the conductive patterns; and
forming patterns of a data line, the source electrode and the drain electrode on the interlayer insulating layer by a single patterning process, the source electrode and the drain electrode being connected to the conductive patterns through the contact holes which extend into the active layer and extend through the gate insulating layer and the interlayer insulating layer, respectively.

11. The method according to claim 9, comprising:
providing a base substrate;
forming a buffer layer on the base substrate;
forming patterns of a gate electrode and a gate line on the buffer layer by a single patterning process;
forming a gate insulating layer on the base substrate with the gate electrode and the gate line;
forming the conductive pattern capable of being connected to the active layer on the gate insulating layer at a position corresponding to the contact hole by a single patterning process;
forming the active layer on the conductive pattern;
forming an interlayer insulating layer on the active layer;
etching the contact holes at positions corresponding to the source electrode and the drain electrode until the contact holes reach the conductive patterns; and
forming patterns of a data line, the source electrode and the drain electrode on the interlayer insulating layer by a single patterning process, the source electrode and the drain electrode being connected to the conductive patterns through the contact holes which extend into the active layer and extend through the interlayer insulating layer, respectively.

12. The display device according to claim 8, wherein the conductive pattern is arranged underneath the active layer.

13. The display device according to claim 8, wherein the conductive pattern has a thickness less than or equal to that of the active layer.

14. The display device according to claim 8, wherein the conductive pattern has a size greater than or equal to that of the contact hole, and arranged at a region corresponding to a source region or a drain region of the active layer.

* * * * *